(12) United States Patent
Jung

(10) Patent No.: US 7,482,552 B2
(45) Date of Patent: Jan. 27, 2009

(54) LASER CRYSTALLIZING DEVICE AND METHOD FOR CRYSTALLIZING SILICON

(75) Inventor: Yun Ho Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 86 days.

(21) Appl. No.: 10/873,500

(22) Filed: Jun. 23, 2004

(65) Prior Publication Data

US 2004/0266146 A1     Dec. 30, 2004

(30) Foreign Application Priority Data

Jun. 30, 2003     (KR)     ............. 10-2003-0043648

(51) Int. Cl.
*C30B 13/22* (2006.01)
*C30B 21/04* (2006.01)
*C30B 15/30* (2006.01)

(52) U.S. Cl. ................. 219/121.66; 219/121.73; 219/121.78; 438/166; 438/308; 438/487; 438/795

(58) Field of Classification Search ............ 219/121.65, 219/121.66, 121.73, 121.78, 121.85; 438/166, 438/308, 487, 795, 798, 799; 427/554, 555; 117/7–10
See application file for complete search history.

(56) References Cited

U.S. PATENT DOCUMENTS

| | | | |
|---|---|---|---|
| 5,143,894 A * | 9/1992 | Rothschild et al. ........... 505/220 |
| 5,368,900 A * | 11/1994 | Jelley et al. ................. 427/555 |
| 6,008,144 A * | 12/1999 | Shih et al. ................... 438/795 |
| 6,078,598 A * | 6/2000 | Ohtsuki et al. ................ 372/12 |
| 6,506,635 B1 * | 1/2003 | Yamazaki et al. ............ 438/148 |
| 6,556,334 B2 * | 4/2003 | Lee ............................ 359/230 |
| 6,726,768 B2 * | 4/2004 | Yoon ........................... 117/103 |
| 6,736,895 B2 * | 5/2004 | Jung ............................ 117/37 |
| 6,770,545 B2 * | 8/2004 | Yang ........................... 438/487 |
| 6,800,540 B1 * | 10/2004 | You ............................. 438/486 |
| 6,809,013 B2 * | 10/2004 | Ito ............................... 438/487 |
| 6,825,493 B2 * | 11/2004 | Jung ............................. 257/64 |
| 6,852,609 B2 * | 2/2005 | Yang ........................... 438/487 |
| 6,861,614 B1 * | 3/2005 | Tanabe et al. .......... 219/121.66 |
| 6,875,547 B2 * | 4/2005 | Kim ............................... 430/5 |
| 6,908,835 B2 * | 6/2005 | Sposili et al. ............... 438/487 |
| 7,229,500 B2 * | 6/2007 | Haushalter et al. ............ 117/95 |
| 7,294,857 B2 * | 11/2007 | Kim et al. ...................... 257/72 |
| 7,357,963 B2 * | 4/2008 | Jung ............................ 427/554 |
| 7,384,476 B2 * | 6/2008 | You ............................... 117/8 |
| 2003/0040146 A1 * | 2/2003 | Kang et al. .................. 438/166 |
| 2003/0194613 A1 * | 10/2003 | Voutsas et al. .................. 430/5 |
| 2004/0253840 A1 * | 12/2004 | You ............................ 438/799 |
| 2005/0003591 A1 * | 1/2005 | Takaoka et al. ............. 438/151 |
| 2005/0095762 A1 * | 5/2005 | Kim ............................. 438/166 |
| 2006/0121369 A1 * | 6/2006 | Hwang ........................... 430/5 |

FOREIGN PATENT DOCUMENTS

JP     360044194 A  *  3/1985

(Continued)

*Primary Examiner*—Samuel M Heinrich
(74) *Attorney, Agent, or Firm*—McKenna Long & Aldridge LLP

(57) ABSTRACT

A laser crystallizing device including a mask divided into two regions, having open parts of the same shape at complementary positions; and a light-shielding pattern selectively leaving one region of the mask open and masking the other region.

2 Claims, 20 Drawing Sheets

FOREIGN PATENT DOCUMENTS

| | | | |
|---|---|---|---|
| JP | 06320292 A | * | 11/1994 |
| JP | 409266325 A | * | 10/1997 |
| JP | 02000124757 A | * | 4/2000 |
| JP | 02000343257 A | * | 12/2000 |
| JP | 2001156017 A | * | 6/2001 |
| KR | 20020091352 A | * | 6/2002 |
| KR | 2003031496 | * | 1/2003 |
| KR | 2003100635 | * | 4/2003 |
| KR | 2003-0051438 | | 6/2003 |

* cited by examiner

FIG. 12A
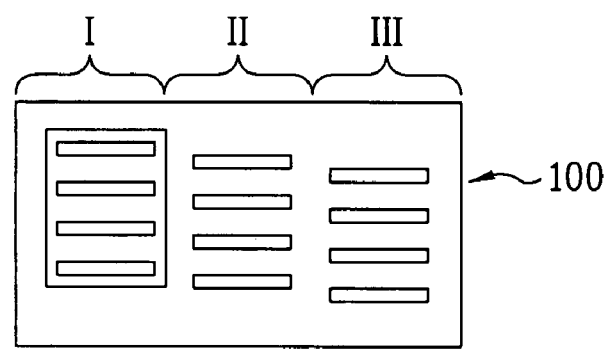
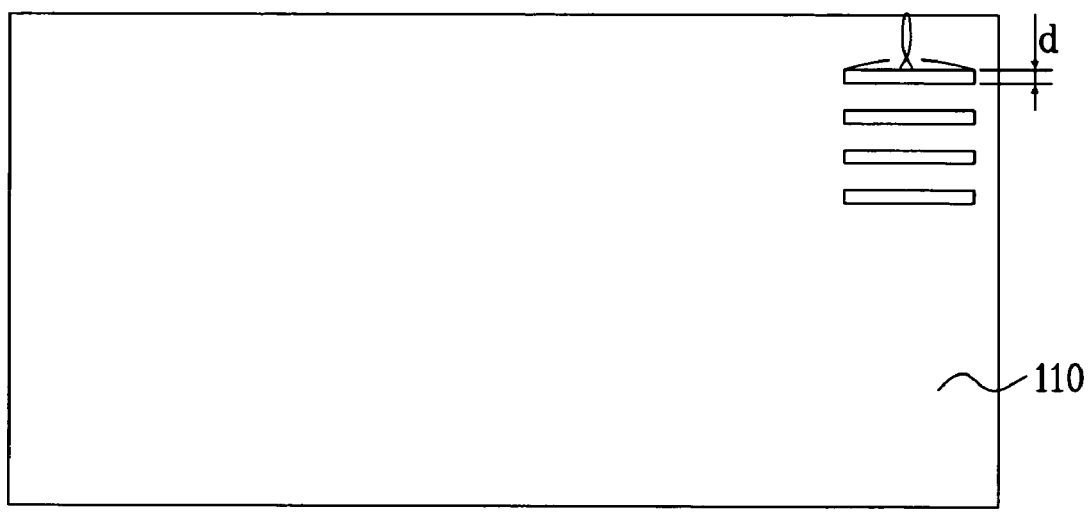

FIG. 12B
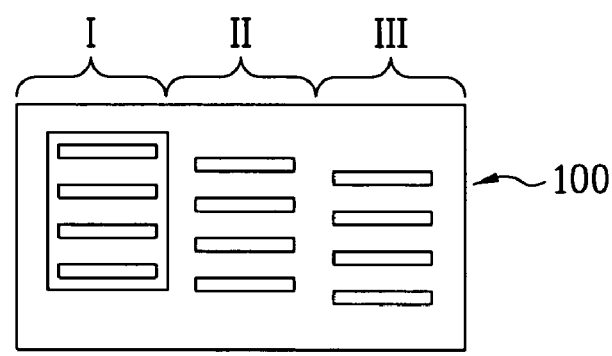
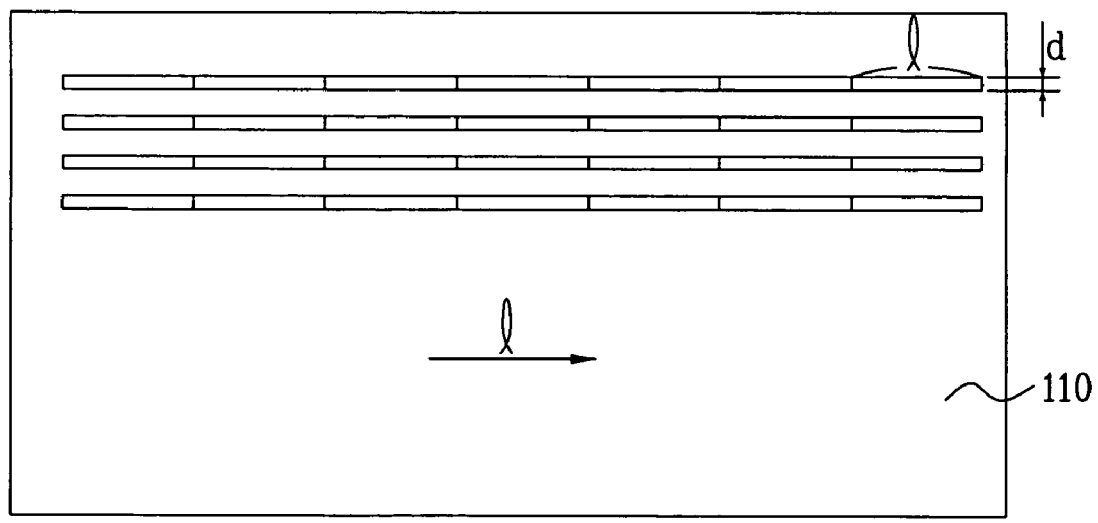

FIG. 12C
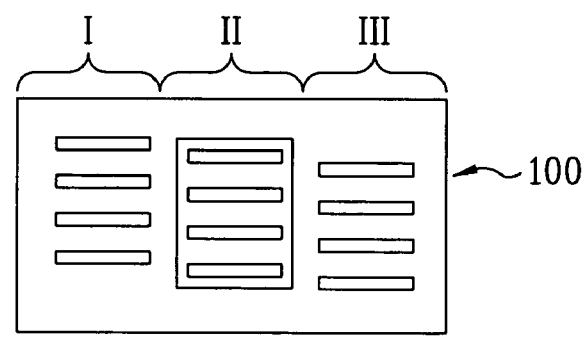
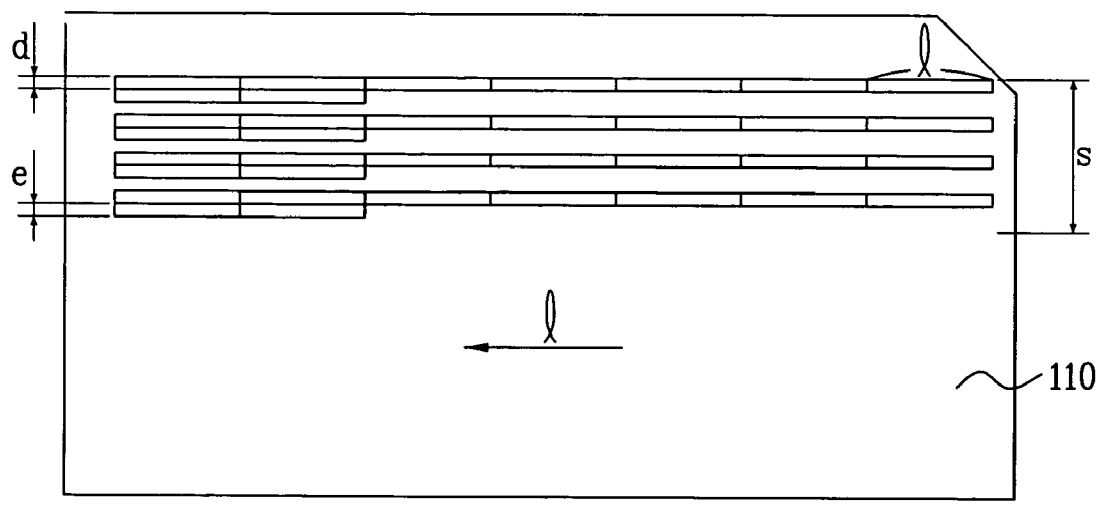

FIG.12D
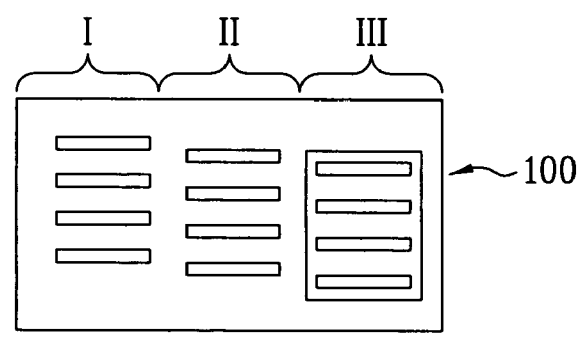
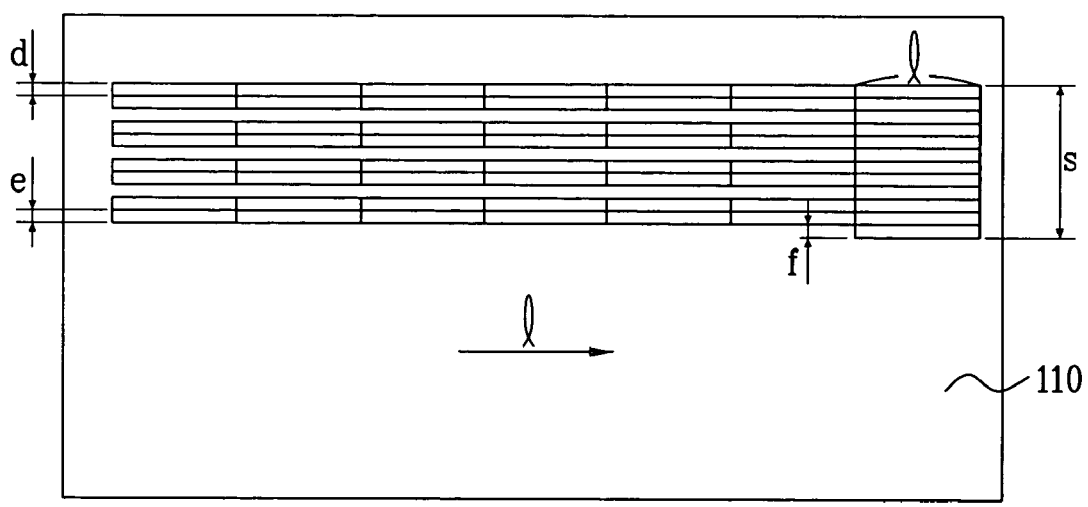

LASER CRYSTALLIZING DEVICE AND METHOD FOR CRYSTALLIZING SILICON

This application claims the benefit of the Korean Application No. P2003-43648, filed on Jun. 30, 2003, which is hereby incorporated by reference.

BACKGROUND OF THE INVENTION

1. Field of the Invention

The present invention relates to silicon crystallization, and more particularly, to a method for crystallizing silicon using a laser crystallizing device including a mask, to shorten the process time by decreasing translation of a state on the Y-axis direction of a large-sized substrate.

2. Discussion of the Related Art

As information technologies develop, various displays are in demand. Recently, many efforts have been made to research and develop various flat display panels such as a liquid crystal display (LCD), a plasma display panel (PDP), an electroluminescent display (ELD), a vacuum fluorescent display (VFD), and the like. Some types of the flat display panels have already been applied to various display devices.

LCD devices are widely used because of their characteristics and advantages, including high quality images, lightweight, thin and compact size, and low power consumption so as to be used in place of cathode ray tubes (CRT) for mobile image display devices. An LCD device has also been developed to receive broadcast signals to display, such as a television, a computer monitor, and the like.

Even if there are significant developments in LCD the technology for an image display in various fields, the image quality fails to meet the characteristics and advantages of an LCD display. In order to use a liquid crystal display device as a display device in various applications, development of an LCD device depends on realizing high image qualities, such as high resolution, high brightness, wide screen, and the like, as well as maintaining the characteristics of lightweight, compactness, and low power consumption.

An LCD display device includes an LCD panel displaying an image and a driving unit that applies driving signals to the LCD panel. The LCD panel includes first and second glass substrates bonded to each other so as to secure a space therebetween, and a liquid crystal layer is injected between the first and second glass substrates.

Formed on the first glass substrate (TFT array substrate) are a plurality of gate lines arranged in one direction at fixed intervals a plurality of data lines arranged in a direction substantially perpendicular to the gate lines at fixed intervals, a plurality of pixel electrodes in pixel areas defined by the gate and data lines crossing each other, and a plurality of thin film transistors switched by signals on the gate lines to transfer signals of the data lines to the pixel electrodes. Formed on the second glass substrate (color filter substrate) are a black matrix layer that shields light in areas outside the pixel areas, an R/G/B color filter layer for realizing colors, and a common electrode for producing an image.

The above-described first and second substrates are separated from each other by spacers to provide a space therebetween, and are bonded to each other through a sealant having a liquid crystal injection inlet. Further, liquid crystal is injected between the two substrates. At this time, the liquid crystal injection method is carried out by maintaining a vacuum state within the gap between the two substrates bonded by the sealant. Then, the liquid crystal injection inlet is dipped in a vessel containing liquid crystal, so as to allow the liquid crystal to be injected into the gap between the two substrates by osmosis. After the liquid crystal is injected as described above, the liquid crystal injection inlet is sealed with an air-tight sealant.

The operating principle of a general liquid crystal display device uses the optical anisotropy and polarization characteristic of liquid crystal. Because of the thin and long structure of liquid crystal, the liquid crystal molecules are aligned to have a specific direction. Also, the direction of the alignment may be controlled by applying an induced electric field to the liquid crystal molecules. Therefore, when the alignment of the liquid crystal molecules is arbitrarily controlled, the alignment of the liquid crystal molecules is eventually altered. Subsequently, due to the optical anisotropy of liquid crystal, light rays are refracted in the direction of the alignment of the liquid crystal molecules, thereby producing image information.

Among current technologies, the active matrix liquid crystal display (LCD), which is formed of a thin film transistor and pixel electrodes aligned in a matrix and connected to the thin film transistor, is considered to be excellent for its high resolution and its ability to represent moving images.

A poly-silicon, having a high electric field mobility and low photocurrent, may be used to form a semiconductor layer of the above-described thin film transistor. The method for fabricating a poly-silicon can be divided into a low temperature fabrication process and a high temperature fabrication process depending upon the fabrication temperature.

The high temperature fabrication process requires a temperature condition approximate to 1000° C., which is equal to or higher than the temperature for modifying substrates. Accordingly, because glass substrates have poor heat-resistance, expensive quartz substrates having excellent heat-resistance should be used. And, when fabricating a poly-silicon thin film by using the high temperature fabrication process, deficient crystallization may occur due to high surface roughness and fine crystal grains, thereby resulting in deficient device application, as compared to the poly-silicon formed by the low temperature fabrication process. Therefore, technologies for crystallizing amorphous silicon, which can be vapor-deposited at a low temperature, to form a poly-silicon are being researched and developed.

The low temperature fabrication process can be categorized into laser crystallizing and metal induced crystallization processes. The laser crystallizing process includes irradiating a pulsed laser beam on a substrate. By using the pulsed laser beam, the solidification and condensation of the substrate can be repeated at a cycle unit of about 10 to $10^2$ nanoseconds. This low temperature fabrication process is known for having the advantage that the damage caused on a lower insulating substrate may be minimized.

The related art silicon crystallization method using laser crystallizing will now be explained in detail. FIG. 1 illustrates a graph showing sizes of amorphous silicon particles by laser energy density. As shown in FIG. 1, the crystallization characteristic of the amorphous silicon may be described as having a first region, a second region, and a third region depending upon the intensity of the laser energy.

The first region is a partial melting region, whereby the intensity of the laser energy irradiated on an amorphous silicon layer melts only the amorphous silicon layer. After the irradiation, the surface of the amorphous silicon layer is partially melted in the first region, whereby small crystal grains are formed on the surface of the amorphous silicon layer after a solidification process.

The second region is a near-to-complete melting region, whereby the intensity of the laser energy, being higher than that of the first region, almost completely melts the amorphous silicon. After the melting, the remaining nuclei are used as seeds for a crystal growth, thereby forming crystal particles with an increased crystal growth as compared to the first region. However, the crystal particles formed in the second region are not uniform. Also, the second region is narrower than the first region.

The third region is a complete melting region, whereby laser energy with increased intensity, as compared to that of the second region, is irradiated to completely melt the amorphous silicon layer. After the complete melting of the amorphous silicon layer, a solidification process is carried out, so as to allow a homogenous nucleation, thereby forming a crystal silicon layer formed of fine and uniform crystal particles.

In the method for fabricating poly-silicon, the number of laser beam irradiations and degree of overlap are controlled in order to form uniform, large and rough crystal particles by using the energy density of the second region. However, the interfaces between a plurality of poly-silicon crystal particles act as obstacles for the electric current flow, thereby decreasing the reliability of the thin film transistor device. In addition, collisions between electrons may occur within the plurality of crystal particles causing damage to the insulating layer due to the collision current and deterioration, thereby resulting in a performance degradation. In order to resolve such problems when using a method for fabricating a poly-silicon by sequential lateral solidification (SLS) crystallization, the crystal growth of the silicon crystal particle occurs at a surface interface between liquid silicon and solid silicon in a direction perpendicular to the surface interface. The SLS crystallization method is disclosed in detail by Robert S. Sposilli, M. A. Crowder, and James S. Im, Mat. Res. Soc. Symp. Proc. Vol. 452, pp. 956-957, 1997.

In the SLS crystallization method, the amount of laser energy, the irradiation range of the laser beam, and the translation distance are controlled, so as to allow a predetermined length of lateral growth of the silicon crystal particle, thereby crystallizing the amorphous silicon into a single crystal. The irradiation device used in the SLS crystallization method concentrates the laser beam to a small and narrow region, and so the amorphous silicon layer deposited on the substrate cannot be simultaneously changed into polycrystalline. Therefore, in order to change the irradiation position on the substrate, the substrate having the amorphous silicon layer deposited thereon is mounted on a stage. Then, after an irradiation in a predetermined area, the substrate is translated so as to allow an irradiation to be performed on another area, thereby carrying out the irradiation process on the entire surface of the substrate. Alternatively, the laser may be mounted on a stage allowing it to move relative to the substrate.

FIG. 2 is a schematic view illustrating a general SLS (Sequential Lateral Solidification) device. Referring to FIG. 2, the general SLS device includes a laser beam generator 1 for generating a laser beam, a focusing lens 2 for focusing the laser beam generated from the laser beam generator 1, a mask 3 for irradiating the laser beam to a substrate 10, and a reduction lens 4 for reducing the laser beam passing through the mask 3 to a smaller size. The laser beam generator 1 generally generates a light beam with a wavelength of about 308 nanometers (nm) using XeCl or 248 nanometers (nm) using KrF in an excimer laser. The laser beam generator 1 discharges an untreated laser beam. The discharged laser beam passes through an attenuator (not shown), in which the energy intensity is controlled. The laser beam is then irradiated to the focusing lens 2.

The substrate 10 having an amorphous silicon layer deposited thereon is fixed to an X-Y stage 5, which faces the mask 3. In order to crystallize an entire surface of the substrate 10, the X-Y stage is minutely displaced, thereby gradually expanding the crystallizing region. The mask 3 includes an open part 'A' allowing the laser beam to pass through, and a closed part 'B' absorbing the laser beam. The width of the open part 'A' determines the lateral growth length of the grains formed after the first exposure.

A method for crystallizing silicon using the general SLS device of FIG. 2 according to the related art will be described as follows. FIG. 3 is a cross-sectional view schematically illustrating the laser crystallizing process according to the related art. As shown in FIG. 3, a buffer layer 21 and an amorphous silicon layer 22 are sequentially formed on a substrate 20. Then, a mask (not shown) with sequentially alternating open parts and closed parts is placed over the substrate 20 having the amorphous silicon layer 22 deposited thereon. Thereafter, the laser irradiation process is performed on the amorphous silicon layer 22. The amorphous silicon layer 22 is generally deposited on the substrate 20 by a chemical vapor deposition (CVD) method, which results in a high content of hydrogen within the amorphous silicon layer 22 immediately after the deposition. However, when heated, hydrogen tends to escape from the thin film. Therefore, a primary heat treatment may be carried out on the amorphous silicon layer 22 in order to perform the dehydrogenation process. When the hydrogen is not eliminated during a prior process, the surface of the crystallized silicon layer becomes rough, thereby resulting in the poor electrical characteristics.

FIG. 4 is a plane view illustrating the substrate including the amorphous silicon layer having a crystallized region with the dehydrogenation process. As shown in FIG. 4, because the laser beam width and the size of a mask are limited, it is impossible to crystallize the entire surface of the substrate 20 at once with a single shot of the laser beam. Accordingly, as the size of the substrate increases, it is necessary to align a single mask several times, and to perform the crystallization process repetitively. If a crystallized region with a size C is defined as one block, the laser beam is irradiated several times to crystallize one block.

FIG. 5 illustrates the crystallized region of the amorphous silicon layer corresponding to the open part after the first irradiation of laser beam with the SLS device of FIG. 2. As shown in FIG. 5, a single shot of the laser beam is irradiated through the mask (not shown) placed over the amorphous silicon layer 22. At this point, the irradiated laser beam passes through the plurality of open parts 'A' formed on the mask. The laser beam then melts and liquidizes the amorphous silicon layer 22. The intensity of the laser energy is selected in the complete melting region, whereby the silicon layer is completely melted.

Similarly, after the laser beam irradiation, a silicon grain 33 grows laterally from the interfaces 32 between the amorphous silicon region and the completely melted and liquidized silicon region towards the center of the irradiated area. The lateral growth of the grain 33 proceeds in a horizontal direction perpendicular to the interface 32. In the irradiated area corresponding to the open part of the amorphous silicon layer 22, when the width of the open part 'A' of the mask is half or less than half the growth length of the silicon grain, the grain growing inwards on both sides of the silicon region in a perpendicular direction comes into contact at a mid-point 31, thereby causing the growth to stop. As described above, after the crystallizing process of a first irradiation, the number of crystallized regions formed in one block is the same as the number of open parts 'A' formed on the mask ('3' of FIG. 2).

Subsequently, in order to achieve further growth of the silicon grain, the stage having the substrate is translated to carry out another irradiation process on an area adjacent to the irradiated area of the prior process. Thus, another crystal is formed, the new crystal being connected to the crystal formed after the first exposure. Similarly, crystals are immediately formed on each side of the completely solidified regions. Generally, the crystal growth length processed by the laser irradiation process and connected to the irradiation part is in the range of 1.5 to 2 micrometers (µm). By repetition of the aforementioned process, as shown in FIG. 4, the amorphous silicon layer corresponding to one block C is crystallized. However, because the width of the open part A of the mask is smaller than that of the closed part B, the mask is translated several times to crystallize one block C. Accordingly, the process time for crystallization of the amorphous silicon layer increases with each translation of the mask or the stage, thereby lowering yield.

A related art mask having open and closed parts of the same width will be described as follows.

FIG. 6 is a plan view illustrating another mask used in the related art SLS device. Referring to FIG. 6, a mask 40 of the related art SLS device includes open and closed parts A and B formed alternately in a horizontal direction. It is possible to define respective widths 'p' and 'q' of the open and closed parts A and B. In FIG. 6, the open part A has the same width as that of the closed part B. Using this mask, it is possible to crystallize one block of the substrate through a first and second exposure process. Crystallization blocks are formed on the substrate by the primary laser beam passing through the plurality of open parts A of the mask 40. In this case, one block corresponding to the plurality of open parts A and the closed parts B in-between has a length 'S' and a width 'L' corresponding to the length of one open part A.

FIG. 7A to FIG. 7C are plan views illustrating a related art silicon crystallization method using the mask of FIG. 6. Generally, a laser beam irradiation device has a reduction lens below the mask 40, whereby a laser beam pattern irradiated on the substrate 50 through the mask 40 is reduced by a constant rate of the reduction lens. For example, in case when the reduction rate is '5', the length and width of the open part A of the mask 40 are set as 'L' and 'p', one crystallization region of one block irradiated with the laser beam through the open part A of the mask has a length of L/5 and a width of p/5. Herein, as one laser pulse is irradiated to the substrate 50 through the mask 40 and the reduction lens, the crystallization process is carried out on a block having a width 'l' and a length 's'.

As shown in FIG. 7A, the substrate 50 is on the stage (not shown), and then the mask 40 is arranged corresponding to the substrate 50. Then, as shown in FIG. 7B, the substrate 50 corresponding to the mask 40 is translated along the X-axis direction to the right a distance corresponding to the length 'l' of one crystallization region, thereby producing lines of crystallization corresponding to the number of the open parts A of the mask 40. Accordingly, the crystallization for the X-axis direction to the right is completed as the open parts A reach the edge of the substrate 50.

As shown in FIG. 7C, the stage is translated upward along the Y-axis direction at a range corresponding to a width 'a' of one crystallization region, so that open parts A of the mask 40 correspond to the non-amorphous regions. Then, the stage is translated along the (–) X-axis direction at a distance corresponding to the length of one crystallization block, whereby the crystallization proceeds along the line of the open parts A of the mask by translating the substrate 50 relative to the mask 40. After completing the crystallization along the (–) X-axis direction on the substrate 50, the crystallization area on the substrate 50 is the length of the substrate×the length (s+a), which includes the length 's' of one block and the width 'a' of one crystallization region. Subsequently, when the stage is translated upward along the Y-axis direction a distance corresponding to the length 's' of one block, the process of FIG. 7A to FIG. 7C is repetitively carried out on the substrate 50, thereby completing the crystallization on the entire surface of the substrate 50. In the related art silicon crystallization method, the crystallization is processed along the X-axis direction. However, it is possible to process the crystallization on the Y-axis direction by rotating the mask 40 90°.

However, the related art silicon crystallization method has the following disadvantages. In the related art silicon crystallization method, after crystallizing the substrate along the X-axis direction to the right or the X-axis direction to the left, when the laser irradiation crystallizes the uncrystallized portions by changing the translation direction of the stage along the X-axis, it requires the minute translation of the stage in the Y-axis direction. Generally, the stage is translated at a range smaller than the width of one crystallization region, for example, between 0.1 µm and 9.9 µm. In this case, the stage along the direction of the X-axis is stopped for a predetermined time period to translate the stage in the direction of the Y-axis. It requires the time $t_1$ to stop the stage from a predetermined speed, the stage stop time is $t_2$, and the acceleration time $t_3$ is the time it takes to translate the stage in the X-axis direction at the predetermined speed. Accordingly, the time $(t_1+t_2+t_3)$ required for changing the translation direction of the stage increases, thereby increasing probability of errors. Especially, in case of the large-sized substrate, this problem becomes more serious.

SUMMARY OF THE INVENTION

Accordingly, the present invention is directed to a laser crystallizing device and a method for crystallizing silicon by using the same that substantially obviates one or more problems due to limitations and disadvantages of the related art.

An object of the present invention is to provide a laser crystallizing device including a mask, and a silicon crystallization method using the same, to shorten the process time by decreasing translation of a substrate along the Y-axis direction.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a laser crystallizing device includes a mask divided into two regions, having open parts of the same shape at complementary positions, and a light-shielding pattern selectively leaving one region of the mask open and masking the other region.

In another aspect, a laser crystallizing device includes a laser generator generating a laser beam; a focusing lens focusing the laser beam generated from the laser generator; a mask divided into at least two regions, having open parts with the same shape at different positions; a reduction lens provided below the mask to reduce the laser beam passing through the mask at a constant rate; a light-shielding pattern selectively leaving one region of the mask open and masking the remaining regions of the mask; and a translation means supporting the mask and the light-shielding pattern and translating the mask to the left and right sides a distance corresponding to a length of one crystallization region.

In another aspect, a silicon crystallization method using a laser crystallizing device having a mask divided into at least two regions having open parts of the same shape at different positions, and a stage translating a substrate, includes providing the substrate on the stage; irradiating one block of the substrate with a laser when a first region is open and a second region is masked; translating the substrate and then irradiating a next block of the substrate with a laser using the first region of the mask; changing the translation direction of the stage and irradiating the substrate after opening the second region and masking the first region; and completing the crystallization of the substrate along the translation direction by repetitively translating the substrate and changing the direction of the stage.

In another aspect, a silicon crystallization method using a laser crystallizing device having a mask divided into at least two regions having open parts of the same shape at different positions, translation means translating the mask, and a stage translating a substrate, includes a first step of providing the substrate on the stage; a second step of irradiating one block of the substrate with a laser when a first region is open and a second region is masked; a third step of irradiating the same block with the laser as the second step when second region is open and the first region is masked; a fourth step of translating the stage to the next block of the substrate with the second region open and irradiating the substrate with a laser; a fifth step of irradiating with a laser the same block as in the fourth step when the first region of the mask is open and second region of the mask is closed; a sixth step of translating the stage to the next block of the substrate with the first region of the mask open and irradiating the next block with a laser; and a seventh step of completing the crystallization of the substrate along a direction along the length of the open parts by repetitively performing the third, fourth, fifth and sixth steps until the final block of the substrate is reached.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 12A to FIG. 12D are plan views illustrating the silicon crystallization process using the mask of FIG. 11 according to the third embodiment of the present invention.

DETAILED DESCRIPTION OF THE ILLUSTRATED EMBODIMENTS

Reference will now be made in detail to an embodiment of the present invention, examples of which are illustrated in the accompanying drawings. Wherever possible, the same reference numbers will be used throughout the drawings to refer to the same or like parts.

Figure 8:
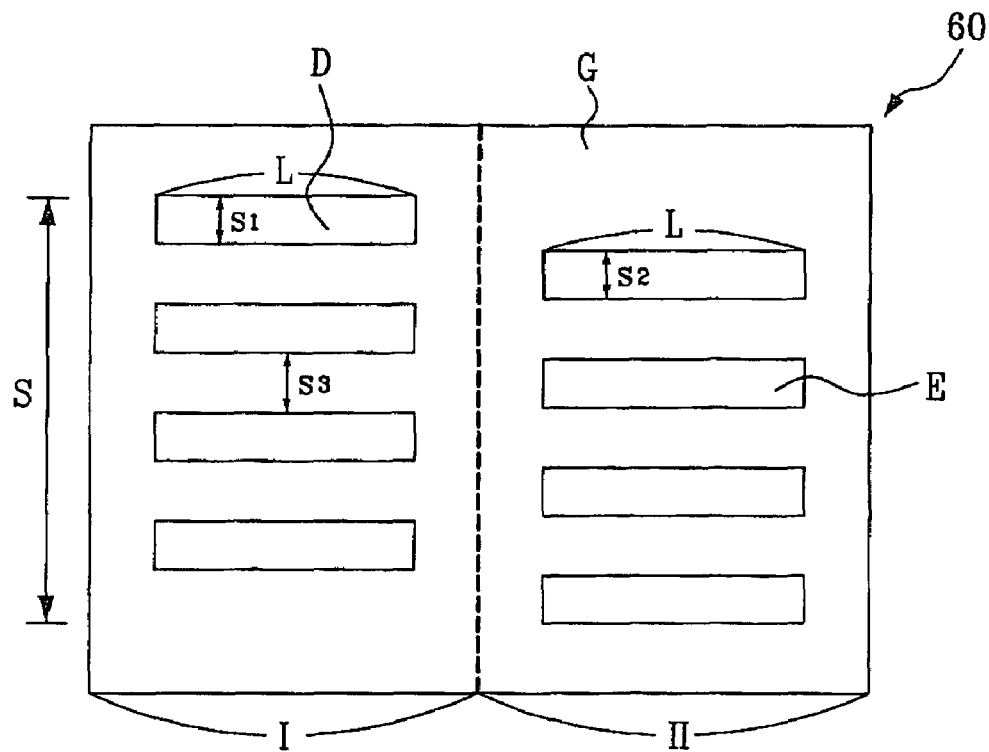
FIG. 8 is a plan view illustrating a mask used for a silicon crystallization method according to the first embodiment of the present invention.
Figure 9A:
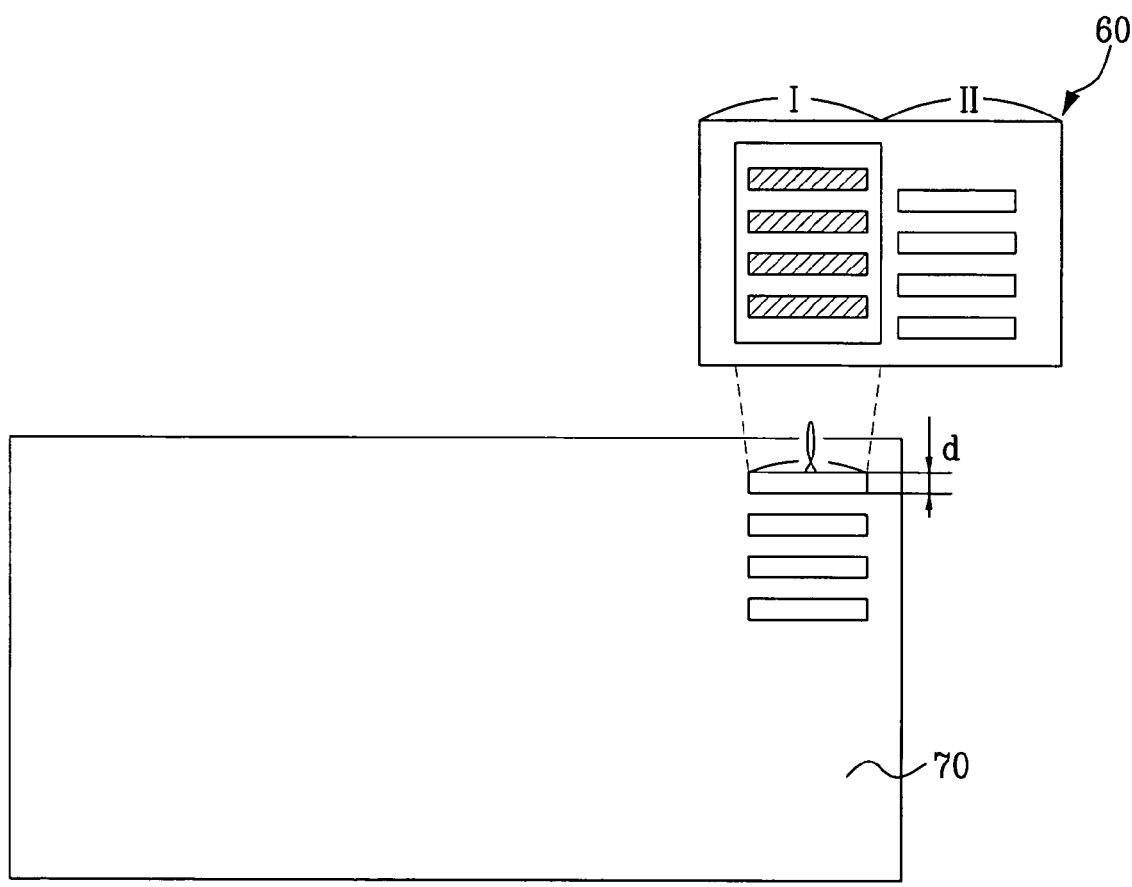
FIG. 9A to FIG. 9C are plan views illustrating the silicon crystallization process using the mask of FIG. 8 according to the first embodiment of the present invention.
Figure 9B:
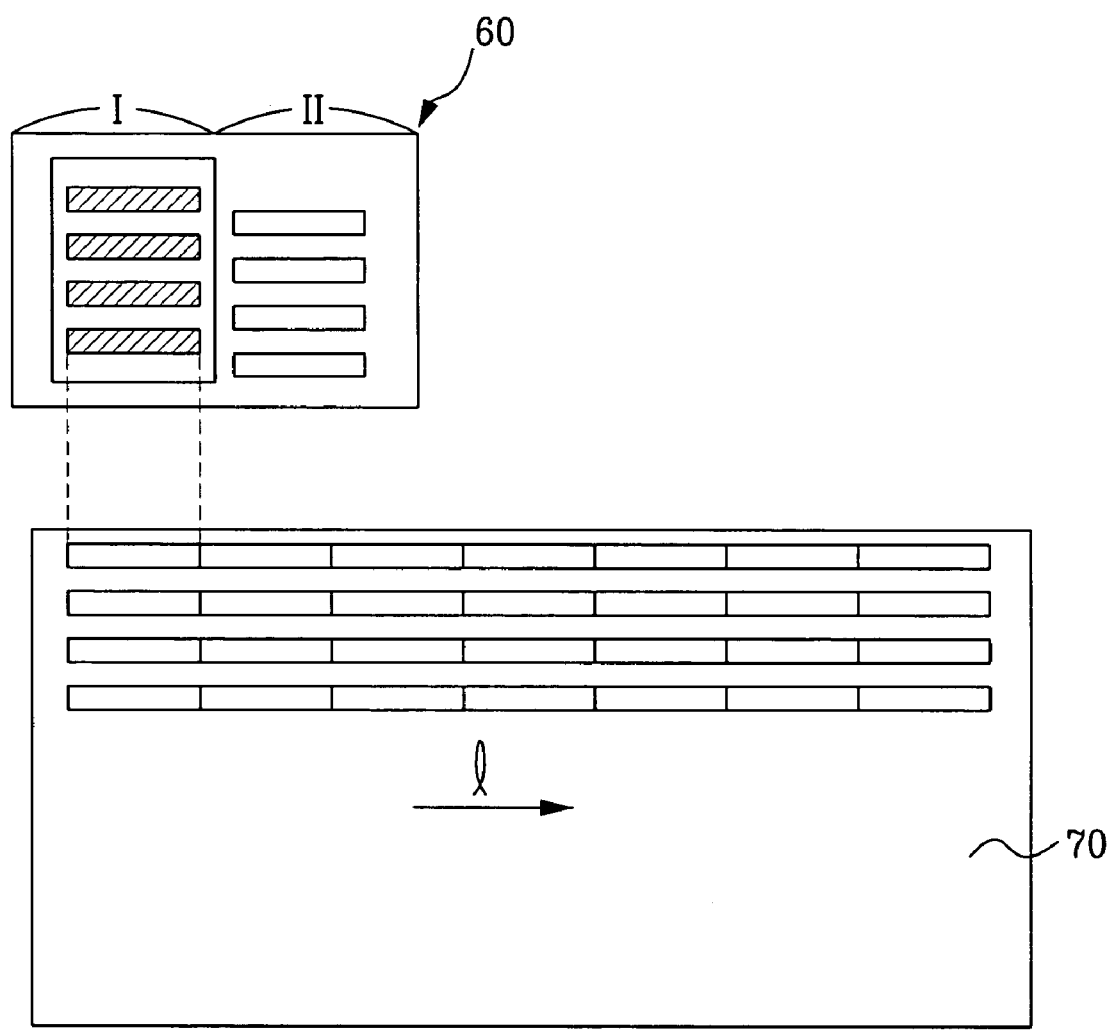
Figure 9C:
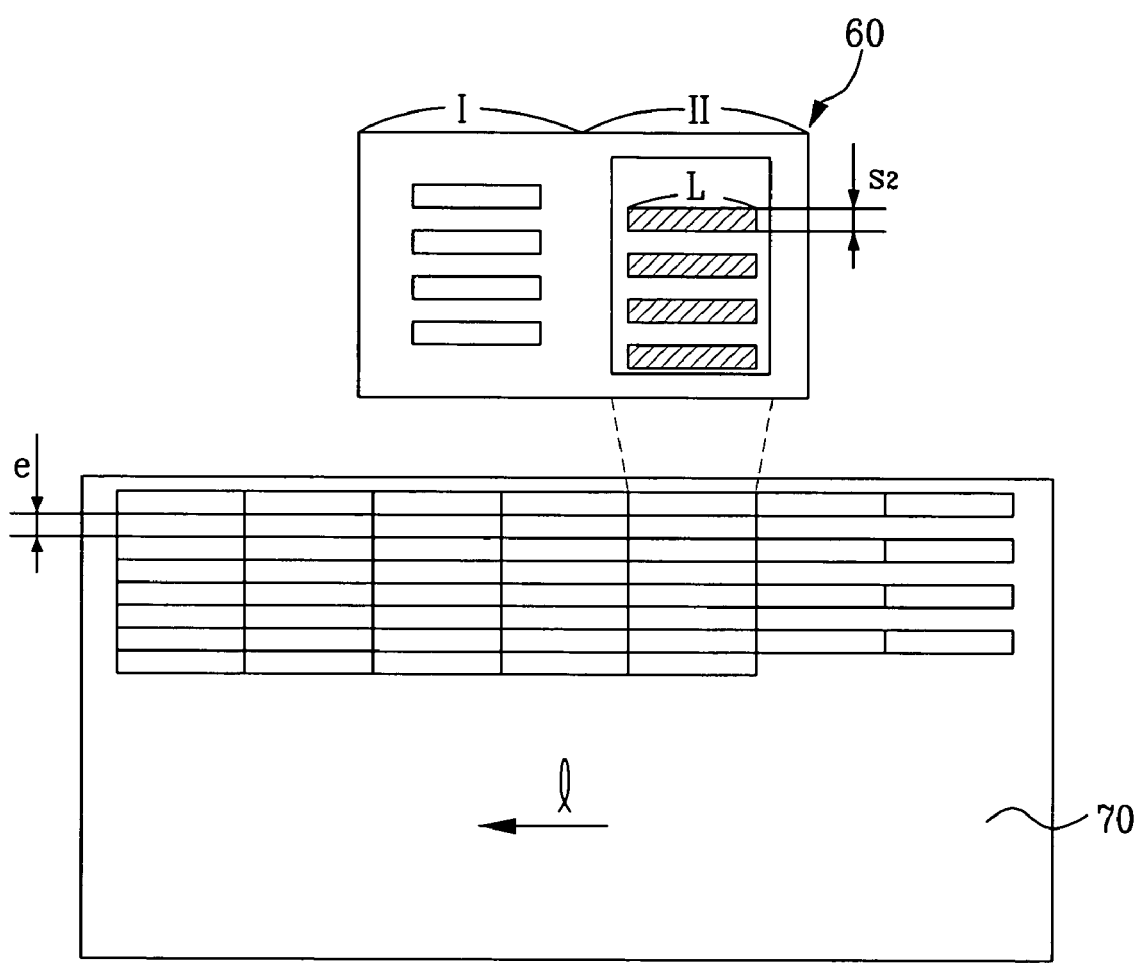

Hereinafter, a silicon crystallization method according to the present invention will be described with reference to the accompanying drawings. FIG. 8 is a plan view illustrating a mask used for a silicon crystallization method according to the first embodiment of the present invention. FIG. 9A to FIG. 9C are plan views illustrating the silicon crystallization process using the mask of FIG. 8 according to the first embodiment of the present invention.

Referring to FIG. 8, the silicon crystallization method according to the first embodiment of the present invention uses a mask 60 having first and second regions I and II, wherein open parts D and E are formed at complimentary positions in the respective first and second regions I and II. In the mask 60, the open parts D and E and a closed part G are alternately formed along the X-axis direction. Also, it is possible to control widths $s_1$ and $s_2$ in the open parts D and E and a width $s_3$ in the closed part G. In FIG. 8, the width $s_1$ and $s_2$ in the open parts D and E is similar to the width $s_3$ in the closed part G. Also, the open parts D and E including the closed part G have a total length 'S', and each open part D and E has a length 'L'.

As shown in FIG. 9A, a laser beam irradiation region of a substrate 70 is formed with a size corresponding to an open part pattern of the mask divided by a constant rate of the reduction lens. Then, when one open part D of the first region I has the length 'L', and the width '$s_1$', one crystallization region of the substrate 70 corresponding to one open part D has a length 'l' and a width 'd'.

Figure 1:
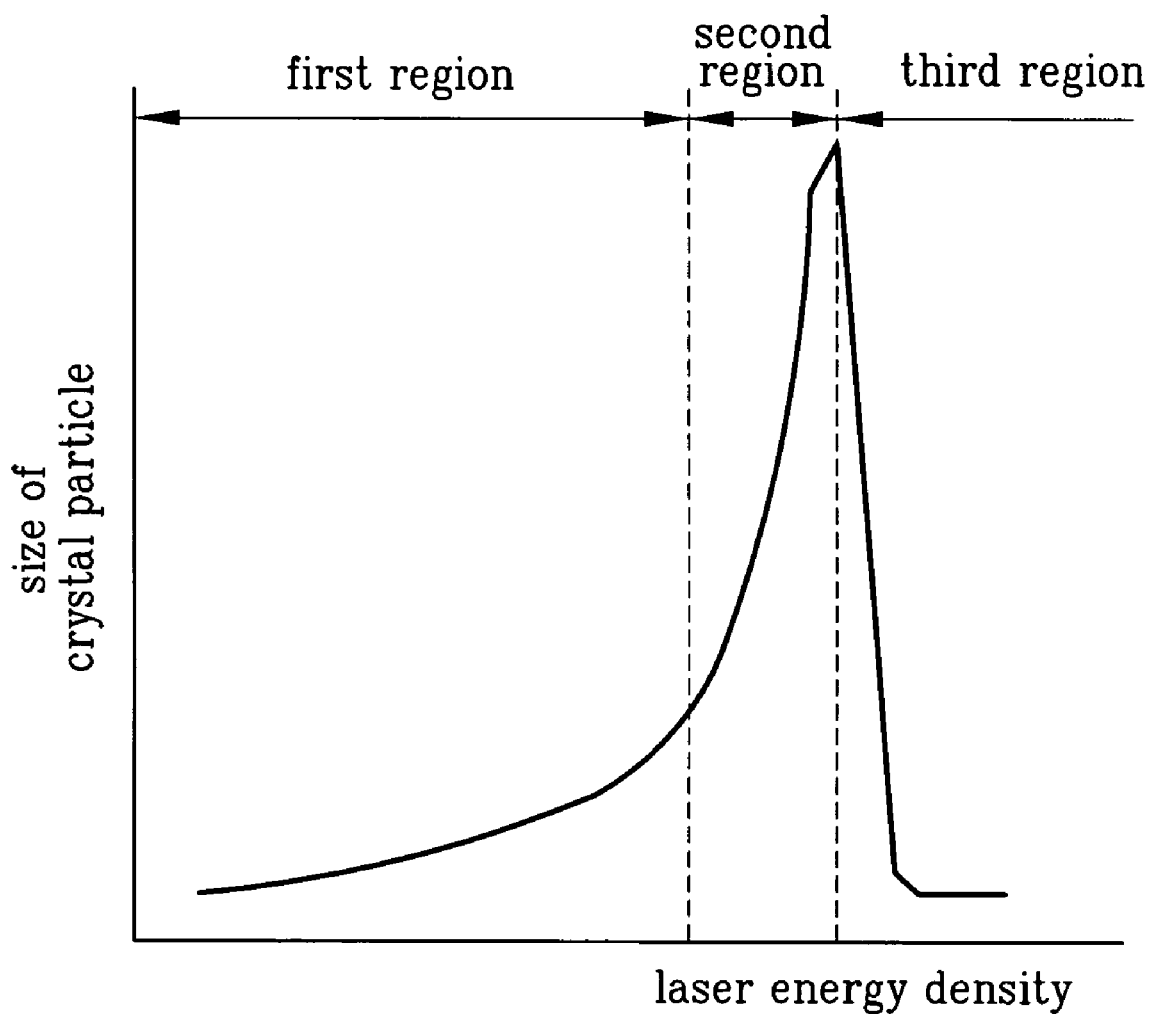
FIG. 1 is a graph illustrating the size of an amorphous silicon grain vs. laser energy density.
Figure 2:
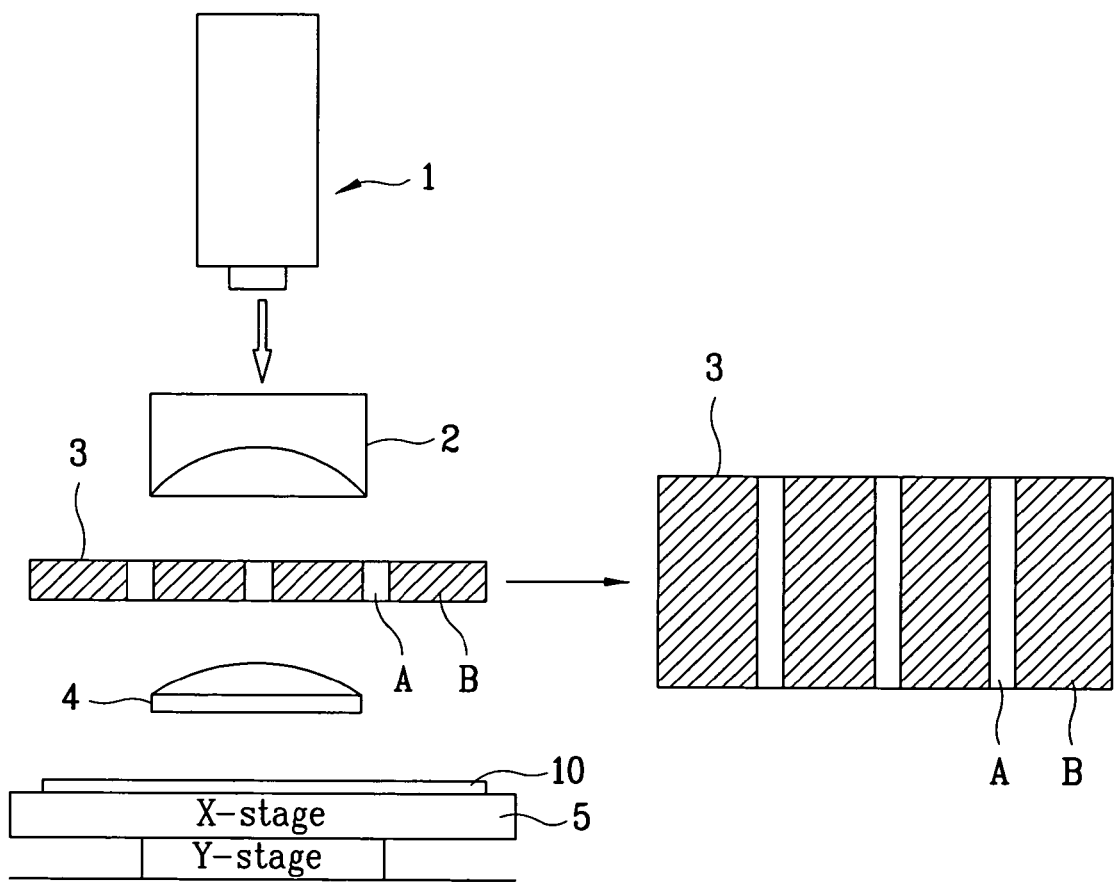
FIG. 2 is a schematic view illustrating a general SLS device.
Figure 3:
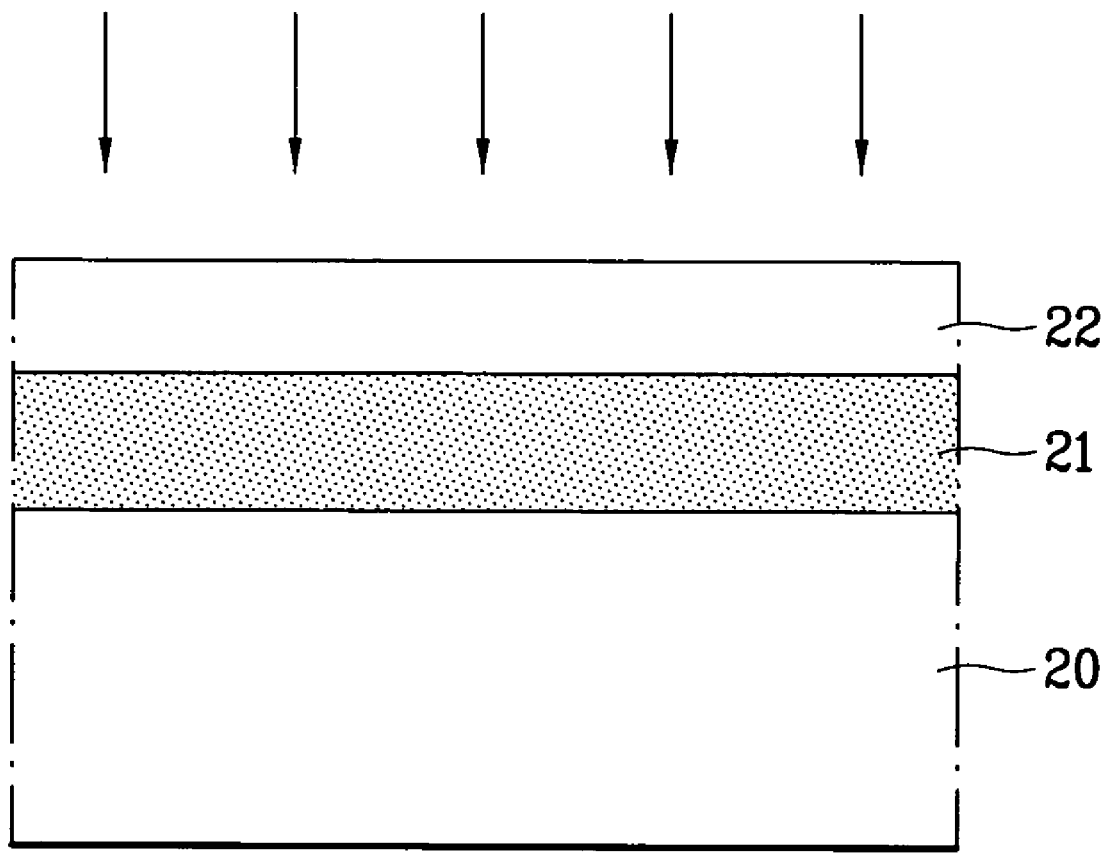
FIG. 3 is a cross-sectional view schematically illustrating the laser crystallizing process according to the related art.
Figure 4:
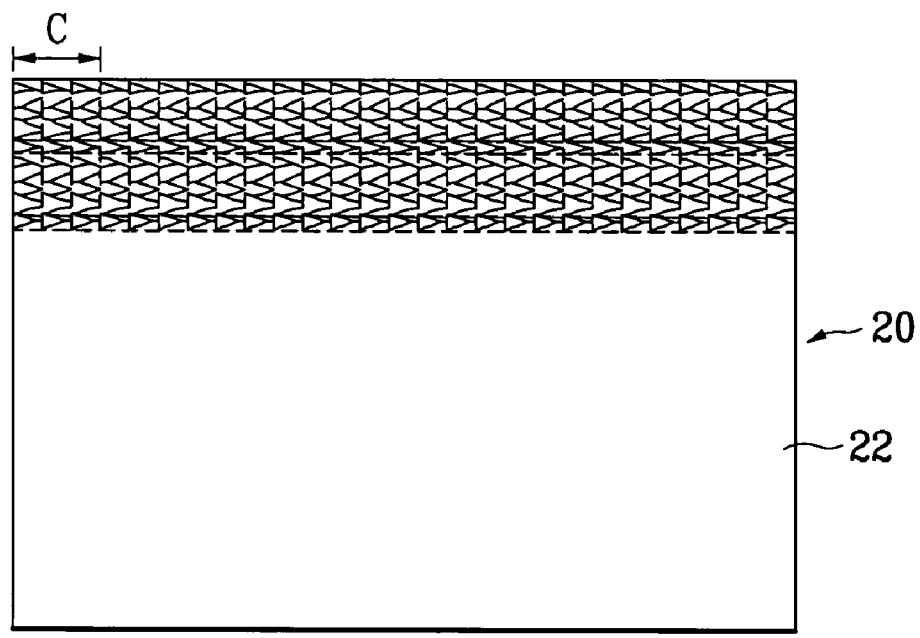
FIG. 4 is a plan view illustrating a substrate including an amorphous silicon layer having a crystallized region without the dehydrogenation process.
Figure 5:
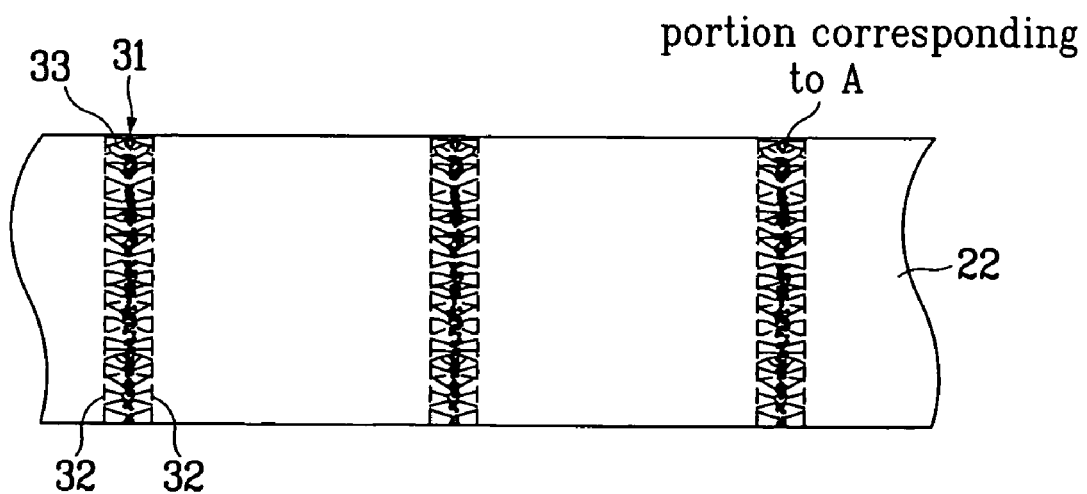
FIG. 5 illustrates a crystallized region of an amorphous silicon layer corresponding to an open part after a single laser beam pulse by using the SLS device of FIG. 2.
Figure 6:
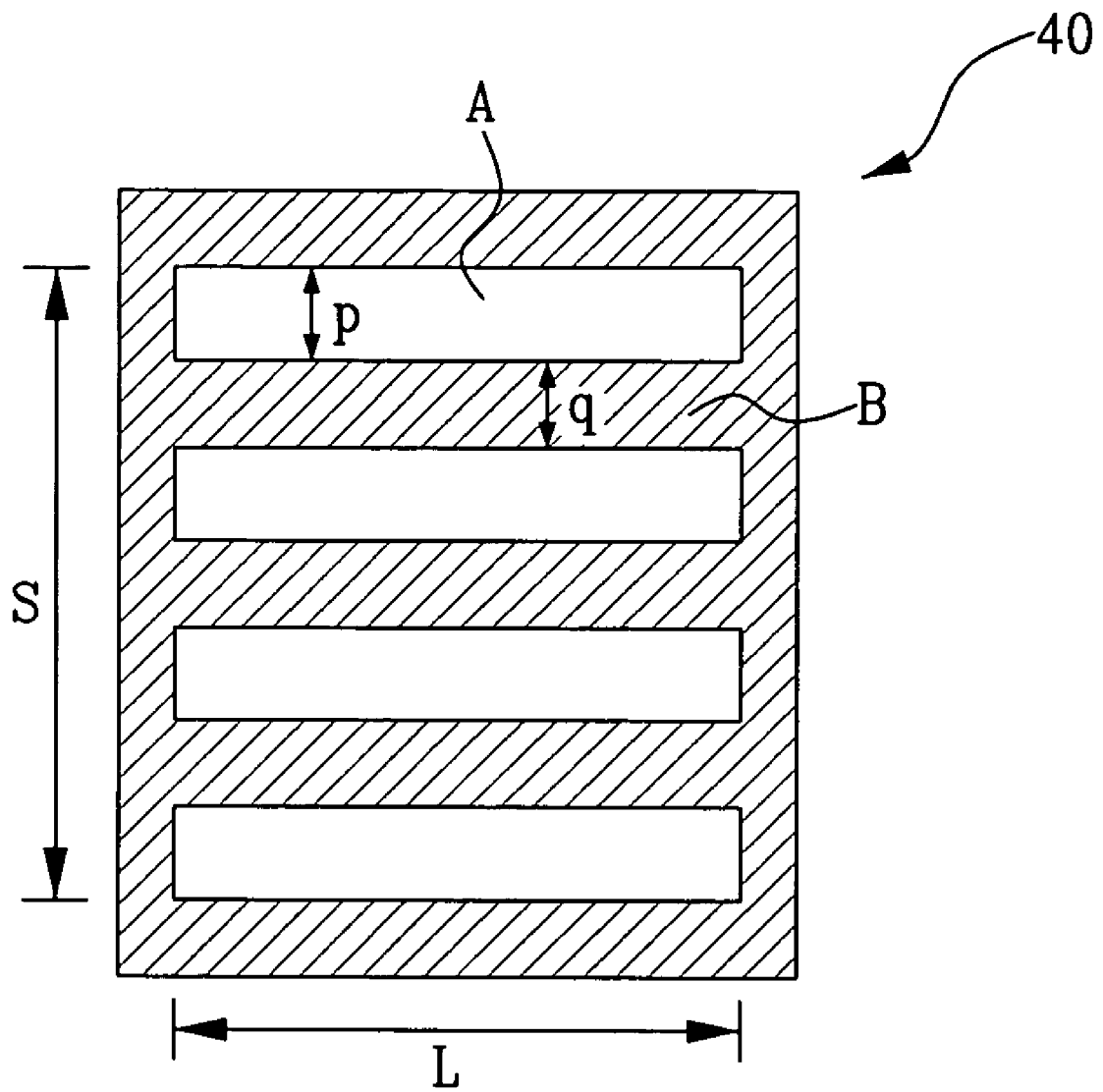
FIG. 6 is a plan view illustrating another mask used for a related art SLS device.
Figure 7A:
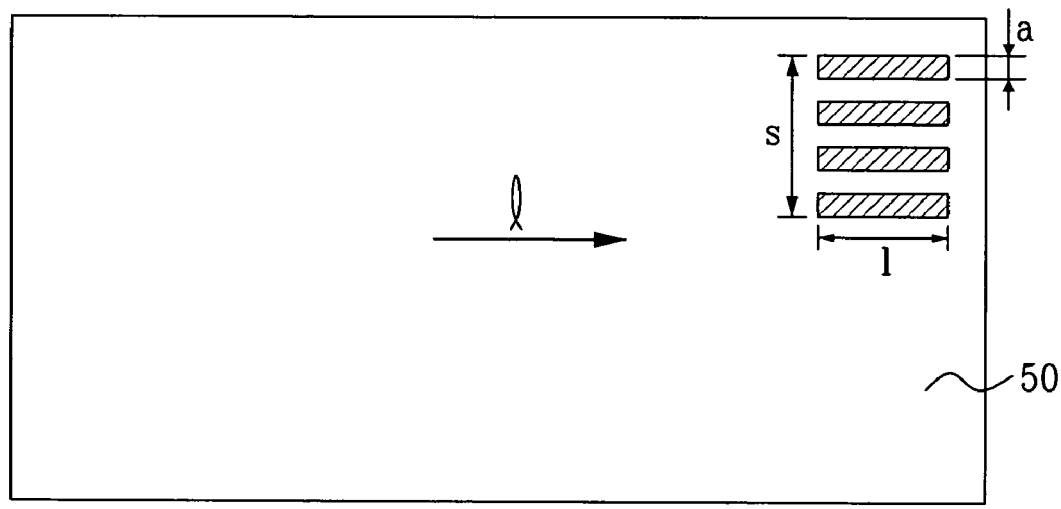
FIG. 7A to FIG. 7C are plan views illustrating the silicon crystallization process using the mask of FIG. 6 according to the related art.
Figure 7B:
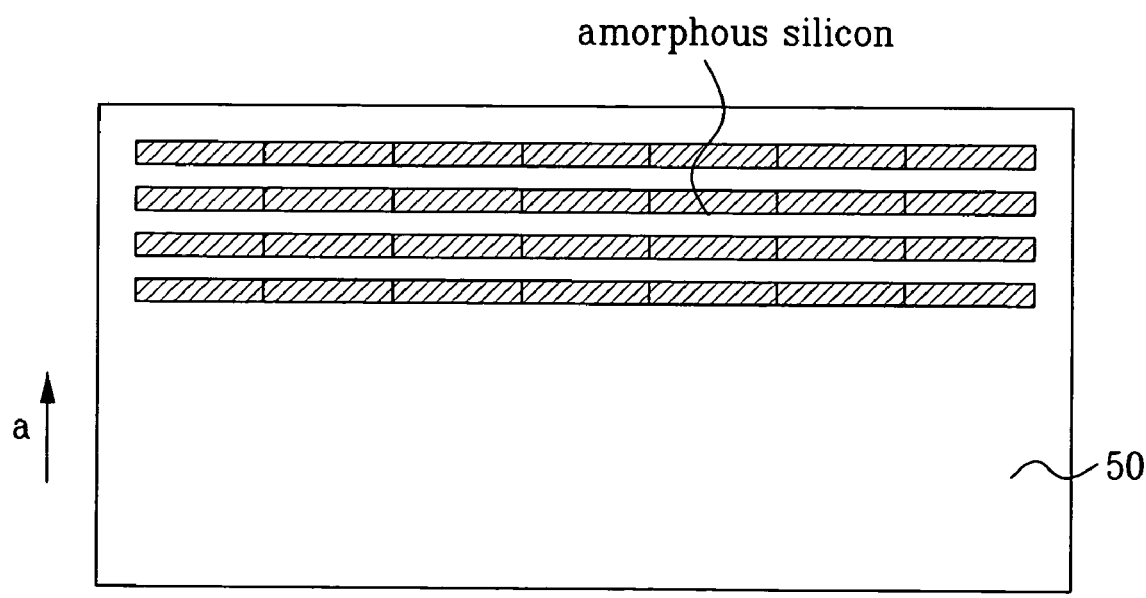
Figure 7C:
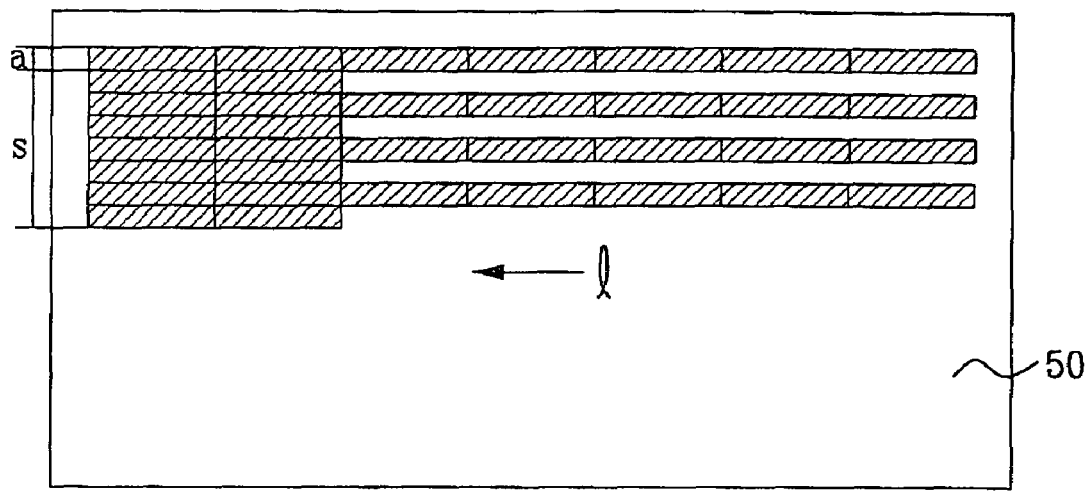

The laser crystallizing device (FIG. 2) having the aforementioned mask according to the first embodiment of the present invention includes a laser generator, a focusing lens, the mask 60, the reduction lens, the light-shielding pattern (not shown), and a stage. The laser generator generates a laser beam, and the focusing lens focuses the laser beam generated from the laser generator. Then, the mask 60 defines 'n' regions of the same size, having the open parts of the same shape at different positions. The reduction lens reduces the laser beam passing through the mask 60 at the constant rate, and the light-shielding pattern (not shown) opens one region of the mask, and masks the remaining regions. Also, the stage is provided to translate the substrate along the X-axis direction and the Y-axis direction.

In a silicon crystallization method using the laser crystallizing device according to the first embodiment of the present invention, as shown in FIG. 9A, a first laser irradiation process is carried out using the opening of the first region of the mask 60, and masking the second region II of the mask 60. Referring to FIG. 9B, the stage is translated along the X-axis direction along a distance corresponding to the length 'l' of one crystallization region using the openings of the first region I of the mask 60. That is, the crystallization proceeds along the X-axis direction corresponding to the open parts D of the first region I of the mask 60, thereby completing the crystallization process on the substrate 70 along a horizontal direction.

As shown in FIG. 9C, the light-shielding pattern is translated and uses the openings of the second region II of the mask 60 while masking the first region I of the mask 60. In this state, the stage is translated along the X-axis direction at a distance corresponding to the length 'l' of one crystallization region, so that the remaining amorphous regions are crystallized using the open parts E of the second region II in the X-axis direction. After opening the second region II and masking the first region I by translating the light-shielding pattern to the first region I of the mask 60, the stage is translated in the X-axis direction such that the second region II is positioned above the last region irradiated with laser by the first region I, and then the stage is translated in the opposite X-axis direction after this laser beam irradiation.

In another embodiment of the present invention the irradiation of the regions I and II of the mask 60 may be performed by alternately positioning the light-shielding pattern over regions I and II by sliding the mask 60 at intervals between the two regions I and II. In order to slide the mask 60 between the two regions, the laser irradiation device requires additional translation means.

Next, the stage is translated in the Y-axis direction at a distance corresponding to a length 'S' of one block of the crystallization region. The process of FIG. 9A to FIG. 9C is repetitively carried out, thereby completing the crystallization on the entire surface of the substrate 70.

In the silicon crystallization method according to an embodiment of the present invention, the mask 60 is in a fixed state, and the crystallization process crystallizes an area with the length of the substrate by the length 'S' of one block of the crystallization regions on the substrate corresponding to the open parts of one region of the mask as the stage translates along the X-axis direction. Next, the mask is moved to the other region of the mask, and the crystallization process proceeds along the substrate using the open parts of the other region of the mask to irradiate the substrate as the stage is translated in the opposite direction along the X-axis direction in the opposite direction. An area with the length of the substrate by the length 'S' of one block of the crystallization region of the substrate is crystallized without translation in the Y-axis direction, thereby saving time in the crystallization process.

In the related art crystallization process using a mask having one pattern, a second laser irradiation is required after a minute translation of a stage in the Y-axis direction. However, in the crystallization method according to the present invention, it is possible to omit the minute translation of the stage in the Y-axis direction. Thus, it is possible to decrease the process time for the silicon crystallization and to prevent errors resulting from the minute translation of the stage along the Y-axis direction.

When using the mask 60 divided into the two regions, it is possible to translate the stage after crystallizing a region on the substrate and to perform the crystallization process with each region of the mask. This will be described with reference to the accompanying drawings. FIG. 10A to FIG. 10E are plan views illustrating a silicon crystallization method using the mask of FIG. 8 according to a second embodiment of the present invention.

In the silicon crystallization method according to the second embodiment of the present invention, the laser crystallizing device having the mask 60 of FIG. 8 will be used to crystallize a substrate 70 on the stage.

Figure 10A:
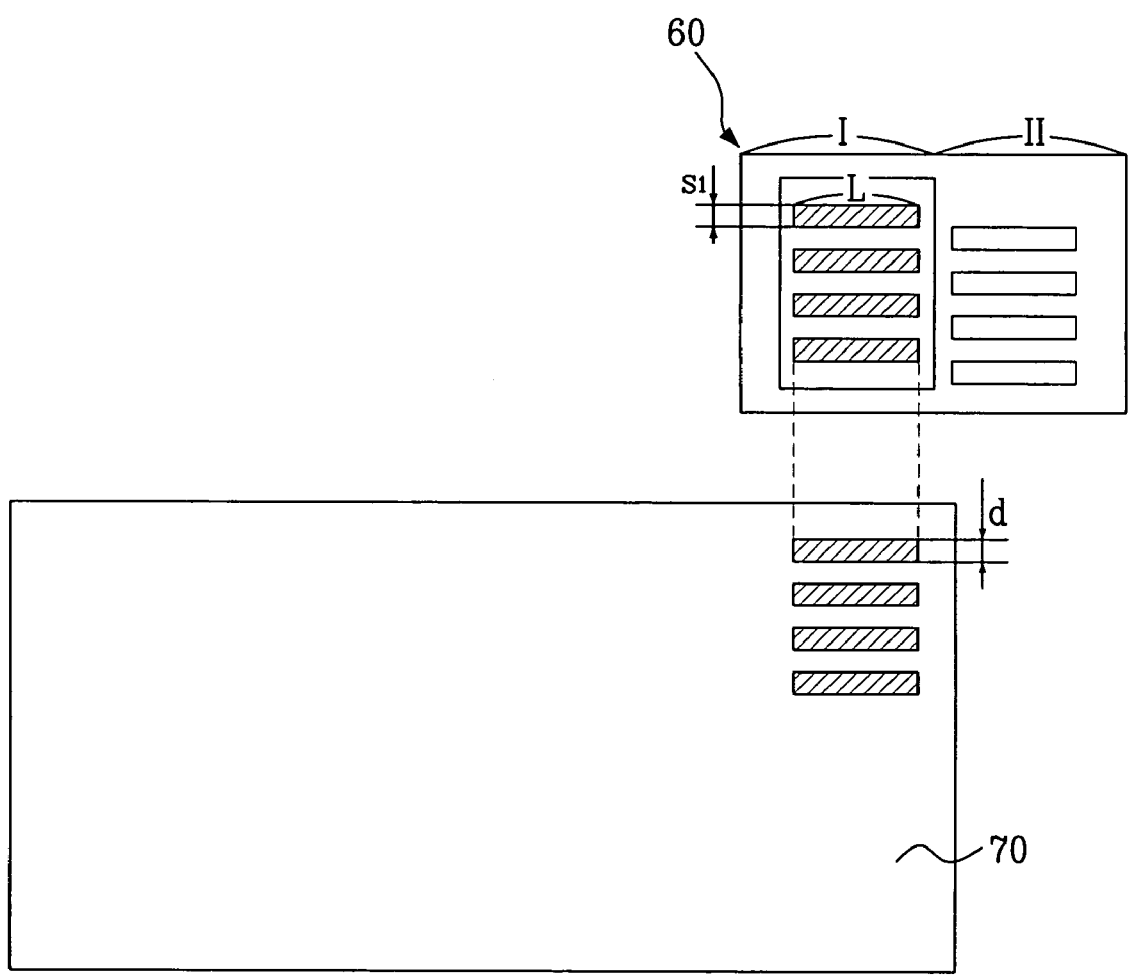
FIG. 10A to FIG. 10E are plan views illustrating a mask used for a silicon crystallization method according to the second embodiment of the present invention.

As shown in FIG. 10A, region I of the mask 60 is placed over the substrate 70, and the second region II of the mask 60. Then, the laser irradiates regions of the substrate 70 through openings in region I of the mask 60. Also, a width 'd' of one crystallization region of the substrate corresponding to one open part D of the mask 60 is twice or less than the size of grain that results from the irradiation of the laser pulse.

Figure 10B:
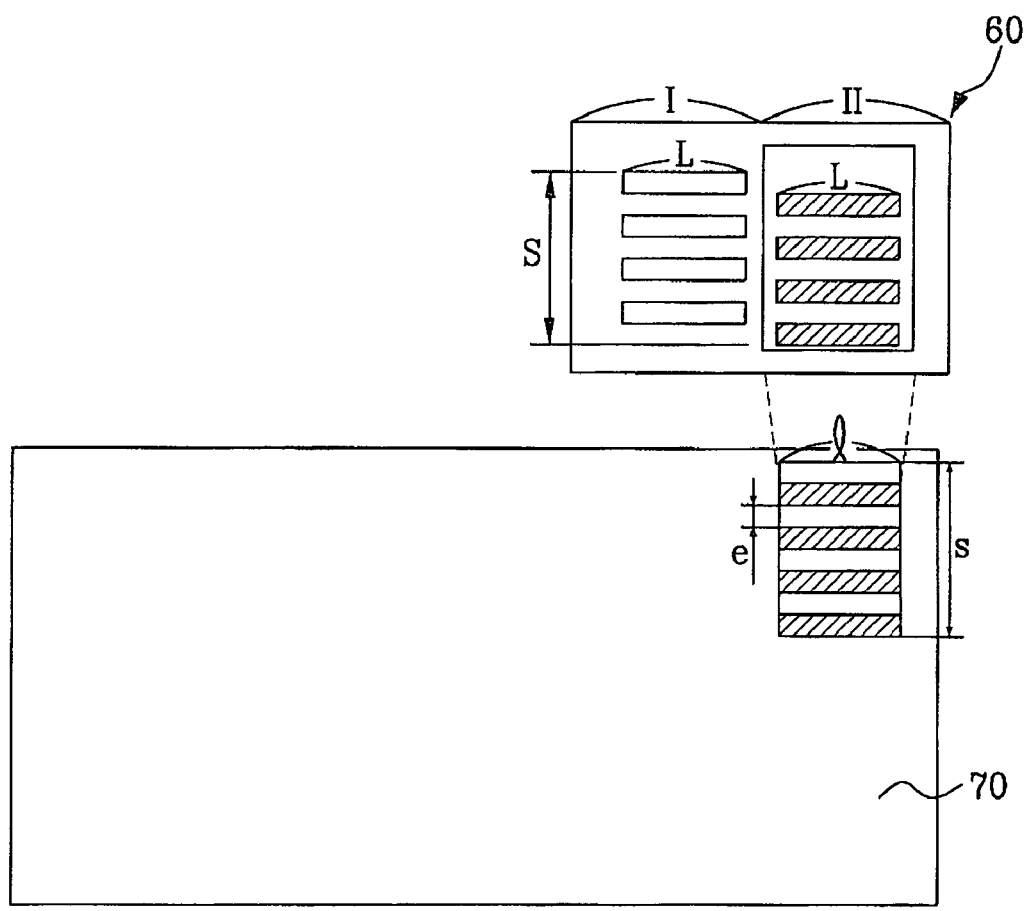

Subsequently, as shown in FIG. 10B, the mask 60 is translated along the X-axis direction at a distance corresponding to the length of approximately one crystallization region, to position the second region II of the mask 60 over the region of the substrate 70 that was just irradiated using region I of the mask 60. The first region I is covered and the laser irradiates the amorphous areas of the substrate between the previously crystallized areas using region II of the mask 60.

Figure 10C:
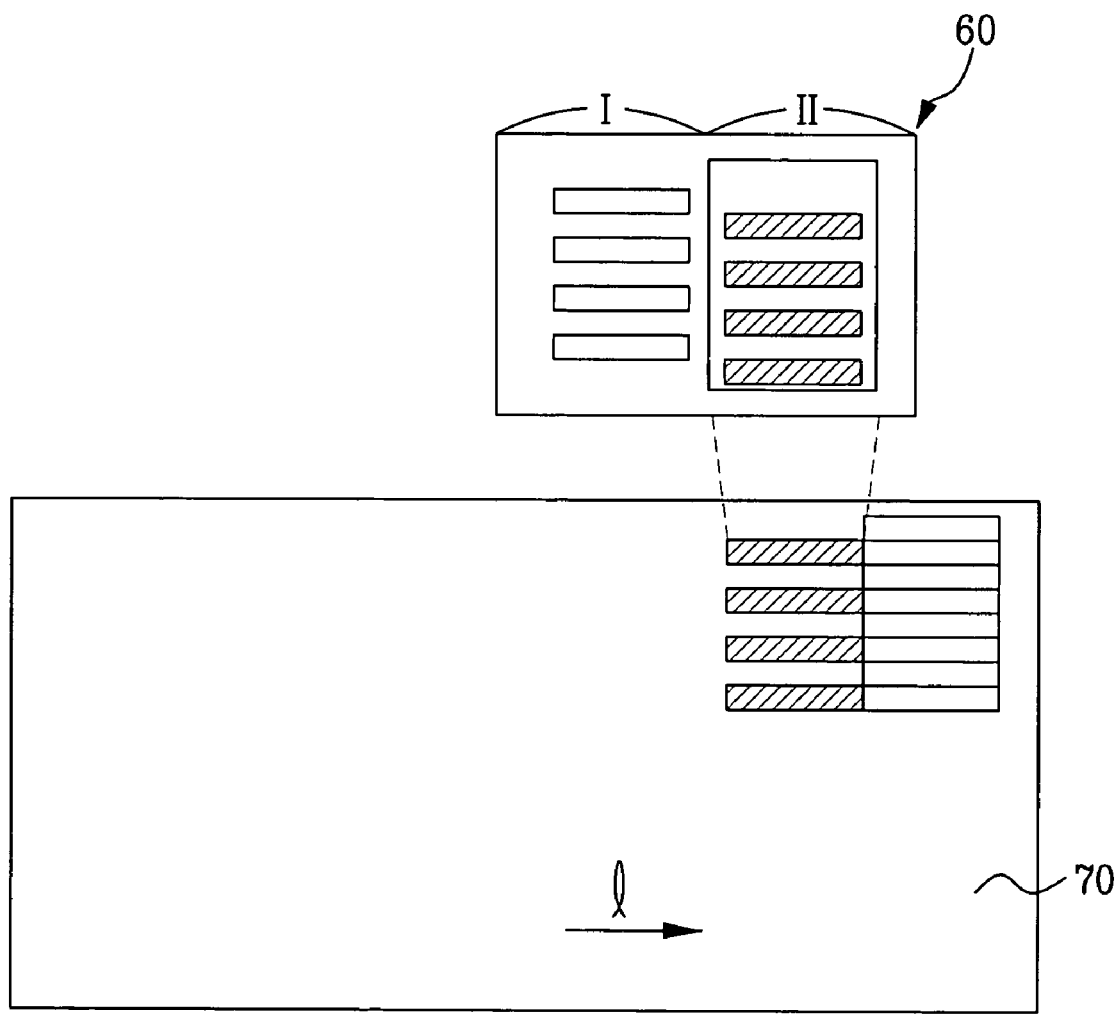

Referring to FIG. 10C, the stage is then translated to the next block along the X-axis direction a distance corresponding to the length 'l' of one crystallization region, and third laser irradiation process is performed on the substrate 70. This results in region II of the mask 60 being positioned adjacent to the previously crystallized area. The second region II of the mask 60 remains uncovered and is used to irradiate the substrate 70.

Figure 10D:
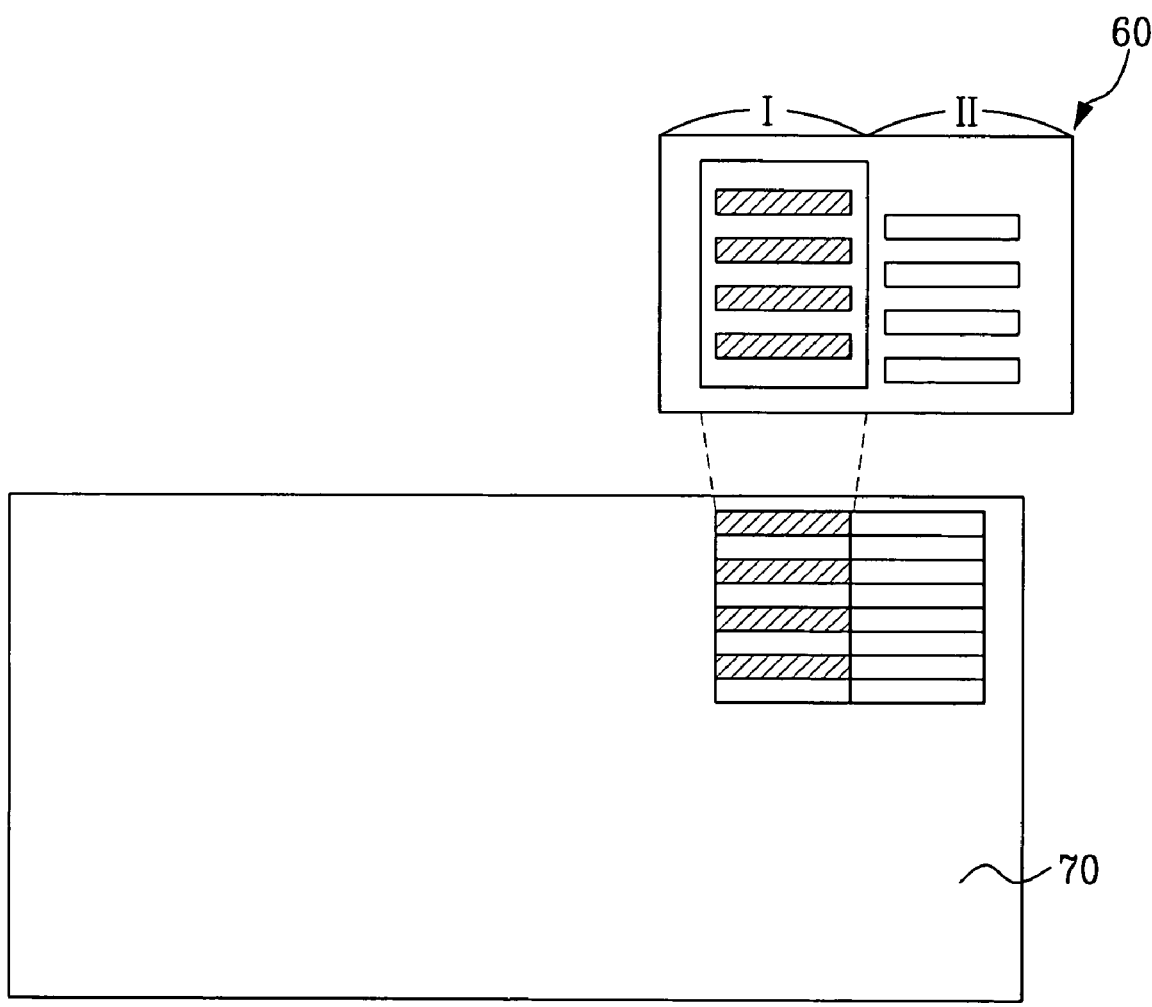

Referring to FIG. 10D, the mask 60 is translated along the X-axis direction back towards the crystallized regions a distance corresponding to approximately one crystallization region. At this time the first region I is uncovered and the second region II is covered. Then, a fourth laser irradiation occurs to crystallize the uncrystallized portions of the amorphous regions among the crystallized regions from the third laser irradiation.

Accordingly, the process of FIG. 10A to FIG. 10D is repetitively carried out by translating the substrate placed along the X-axis direction at a distance corresponding to the length 'l' of one crystallization region, thereby completing the crystallization on the substrate along a horizontal direction. At this point, the area crystallized has an area of the length of the substrate by the length of one block of the crystallization regions.

Figure 10E:
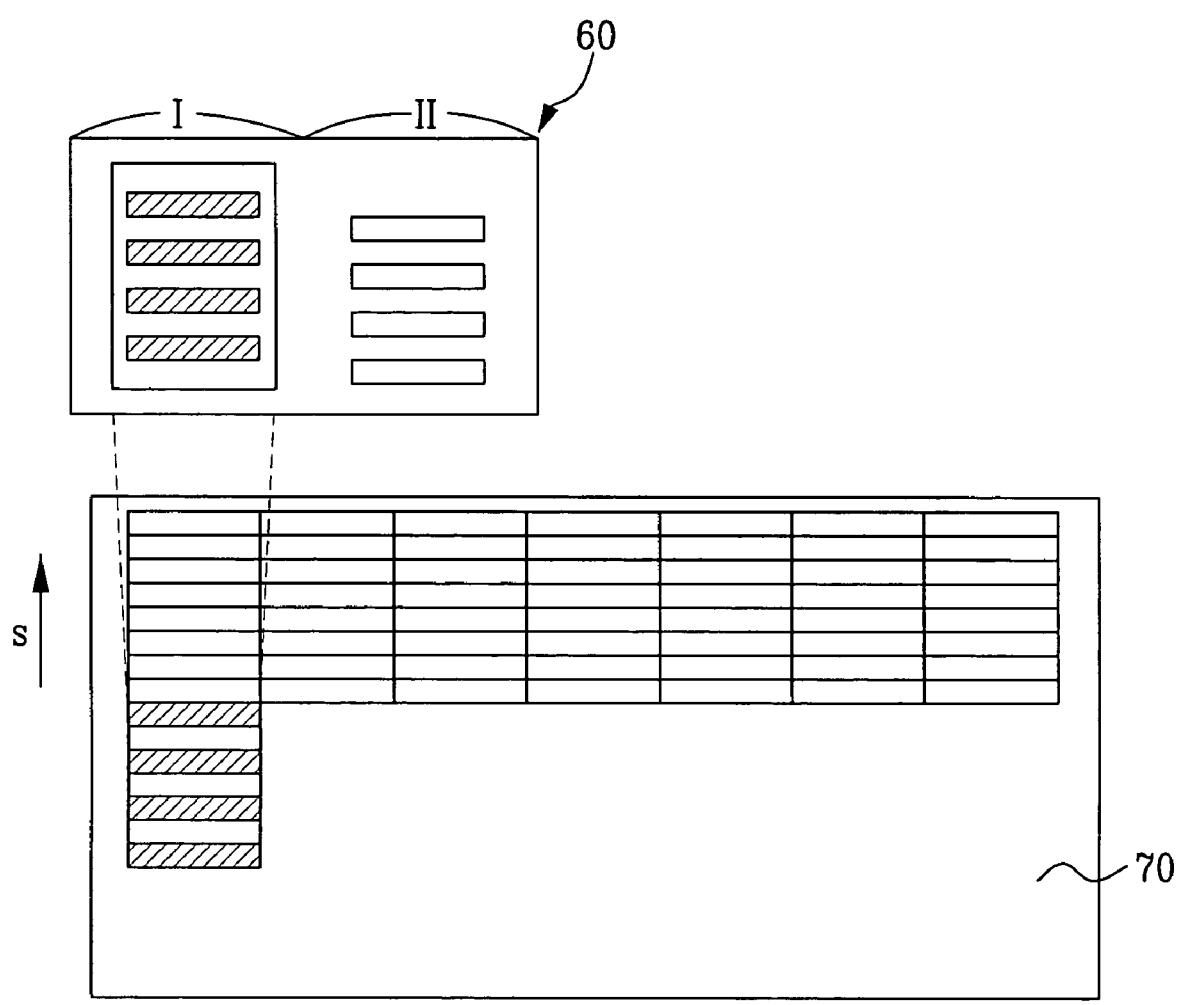

As shown in FIG. 10E, the stage with the substrate 70 is translated along the Y-axis direction a distance corresponding to the length 'S' of one block. Subsequently, the stage is translated along the X-axis direction and the process of FIG. 10A to FIG. 10E is repeated until the entire surface of the substrate is completely crystallized.

Like the silicon crystallization method according to the first embodiment of the present invention, the silicon crystallization method according to the second embodiment of the present invention omits the process of minutely translating the stage in the Y-axis direction to crystallize of one block. However, because the mask is translated for each block, the time to translate the mask is a variable. Unlike the first embodiment of the present invention, the second embodiment of the present invention requires additional means for translating the mask.

Next, a silicon crystallization method using a mask divided into three regions according to a third embodiment of the present invention will be described with reference to the accompanying drawings.

Figure 11:
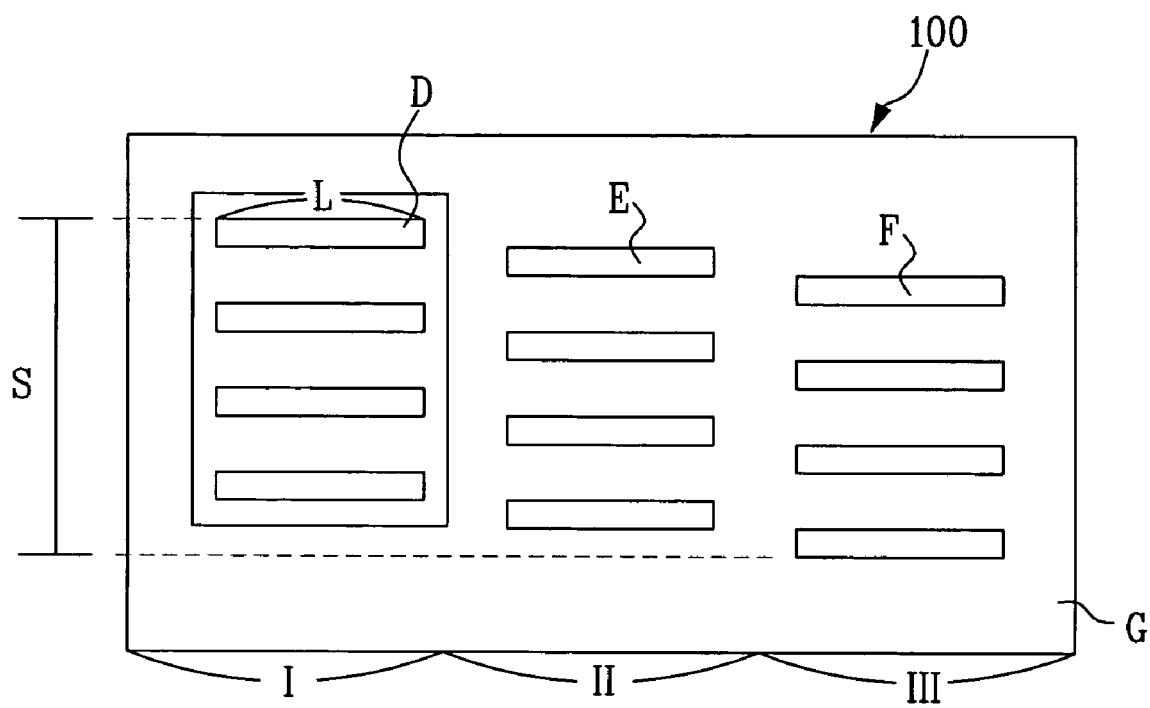
FIG. 11 is a plan view illustrating a mask used for a silicon crystallization method according to the third embodiment of the present invention.

FIG. 11 is a plan view illustrating a mask used for a silicon crystallization method according to the third embodiment of the present invention. As shown in FIG. 11, a mask 100 is divided into first, second and third regions I, II and III of the same size, having open parts D, E and F at complementary positions in the respective regions I, II and III. The plurality of open parts D, E and F and closed parts G of the mask 100 are alternately formed along the X-axis direction, wherein each of the open parts D, E and F has the same length 'L' and the same width but are offset in the Y-axis direction with one another. The three regions are applied to an area of the substrate to form a crystallized block with a width 'l' and a length 's'. In addition, it is possible to use the mask of FIG. 11 with the laser crystallizing device according to the first embodiment of the present invention.

The laser crystallizing process using the aforementioned laser crystallizing device is carried out as follows. First, the laser irradiates the substrate through the open part D of the first region I of the mask 100, while masking the remaining regions II and III. Next, the mask 100 is translated towards the left side a distance corresponding to one block and the laser irradiates the substrate using the second region II. This process is then repeated for region III resulting in a completely crystallized block on the substrate. Also, the unused regions of the mask are covered when the substrate is irradiated.

The aforementioned laser crystallizing device also includes a light-shielding pattern for covering the unused regions of the mask 100 and a reduction lens below the mask 100. Thus, a laser beam irradiation region of the substrate 110 is formed with a size corresponding to an open part pattern of the mask 100 divided by a constant rate of the reduction lens. In this case, one crystallization region of the substrate 110 corresponding to each open part D, E and F of the mask 100 has a length 'l' and a corresponding width 'd', 'e' or 'f'. In FIG. 11, the widths 'd', 'e' and 'f' of the open parts 'D', 'E' and 'F' are the same value. However, the widths 'd', 'e' and 'f' of the open parts 'D', 'E' and 'F' may have different values.

A silicon crystallization method according to a third embodiment of the present invention uses the laser crystallizing device with the mask 100 of FIG. 11 to crystallize the substrate 110 corresponding to the mask 100.

FIG. 12A to FIG. 12C are plan views illustrating the silicon crystallization method using the mask of FIG. 11 according to the third embodiment of the present invention.

Referring to FIG. 12A, the laser irradiates a predetermined block of the substrate 110 using the first region I of the mask while masking the second and third regions II and III. Also, a width 'd' of one crystallization region of the substrate corresponding to the open part D of the mask 100 is less than twice the size of grain growing from the irradiation of laser pulse.

Next, the stage is translated to the left along the X-axis direction a distance corresponding to the length 'l' of one crystallization region for the first region I of the mask 100. The laser irradiation then proceeds along the horizontal direction of the substrate 110 using the open parts D of the mask 100 to crystallize an area of the substrate 110.

As shown in FIG. 12C, the stage is next translated to the right along the X-axis direction a distance corresponding to the length 'l' of one crystallization region for the second region II of the mask 100. The laser irradiation then proceeds along the horizontal direction using the open parts E of the mask 100, to crystallize a second area of the substrate 110. In this case, one crystallization region of the substrate 110 corresponding to an open part E of the mask 100 has a length 'l' and a width 'e'. The stage is translated to the right along the X-axis direction at a range corresponding to the length 'l' of one crystallization region and the length of the open part, thereby completing the crystallization of a second area of the substrate 110 corresponding to the second region II of the mask 100.

As shown in FIG. 12D, after the third region is uncovered, the stage is translated to the left along the X-axis direction a distance corresponding to the length 'l' of one crystallization region, thereby completing the crystallization of a group of blocks in a horizontal direction along the substrate.

Next, the stage is translated downward along the Y-axis direction at a distance corresponding to the length 'S' of one block. A minute translation of the stage in the Y-axis direction is not required as described in the related art, but instead the stage is translated along the Y-axis direction a distance corresponding to the length 'S' of one block.

Like the first embodiment of the present invention, the silicon crystallization method according to the third embodiment of the present invention omits minutely translating the stage in the Y-axis direction during crystallization of one block, thereby reducing the processing time for crystallizing the large-sized substrate.

As mentioned above, the laser crystallizing device according to the present invention and the method of crystallizing the silicon by using the same have the following advantages.

In the aforementioned crystallization method, the mask is divided into a plurality of regions, having open parts at different positions. Then, the laser irradiation proceeds by selectively opening one region of the mask, and masking the remaining regions of the mask. Accordingly, it is possible to omit the minute translation of the stage in the Y-axis direction thereby reducing the processing time to crystallize the large-sized substrate. Also, it is possible to reduce the time for stopping the stage or for turning the direction of the stage, thereby improving the processing yield. Furthermore, it is possible to prevent errors due to the minute translation of the stage along the Y-axis direction.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A silicon crystallization method using a laser crystallizing device having a mask divided into at least first and second regions having open parts of the same shape at different positions, a light-shielding pattern selectively opening one region of the mask and blocking the other region of the mask and a stage translating a substrate, comprising:

providing the substrate on the stage;

opening the first region and blocking the second region by using the light-shielding pattern and irradiating one block of the substrate with a laser through the mask, wherein the block of the substrate corresponds to the same region where the different regions of the mask are positioned for crystallization using the laser irradiation, wherein one block has a width corresponding to the length of the open part, and has a length corresponding to a total width of the open parts from the first open part to the final open part, wherein the length direction of the open part in each region of the mask extends in the X-axis direction;

translating the stage along the X-axis direction to the right and then irradiating a next block of the substrate with a laser using the first region of the mask, wherein the stage is translated a distance corresponding to the length of the open part in the region of the mask;

changing the translation direction of the stage, translating the stage along the X-axis direction to the left, opening the second region and blocking the first region, and irradiating the substrate with a laser through the mask;

2. A silicon crystallization method using a laser crystallizing device having a mask divided into at least first and second regions having open parts of the same shape at different positions, translation means translating the mask, a light-shielding pattern selectively opening one region of the mask and blocking the other region of the mask and a stage translating a substrate, comprising:

a first step of providing the substrate on the stage;

a second step of opening the first region and blocking the second region by using the light-shielding pattern, and irradiating one block of the substrate with a laser through the masks, wherein the block of the substrate corresponds to the same region where the different regions of the mask are positioned for crystallization using the laser irradiation, wherein one block has a width corresponding to the length of the open part and has a length corresponding to a total width of the open parts from the first open part to the final open part, wherein the length direction of the open part in each region of the mask extends in the X-axis direction;

a third step of opening the second region and blocking the first region by using the light-shielding pattern, and then irradiating the same block with the laser as the second step;

a fourth step of translating the stage to the next block of the substrate with the second region open and irradiating the substrate with a laser, wherein the stage is translated along the X-axis direction to the right;

a fifth step of opening the first region and blocking the second region by using the light-shielding pattern, and then irradiating with a laser the same block as in the fourth step;

a sixth step of translating the stage to the next block of the substrate with the first region of the mask open and irradiating the next block with a laser, wherein the stage is translated along the X-axis direction to the right;

a seventh step of completing the crystallization of the substrate along a direction along the length of the open parts by repetitively performing the third, fourth, fifth and sixth steps until the final block of the substrate is reached, wherein the stage is translated along the X-axis direction to the right, wherein the stage is translated along the X-axis direction to the left in the second to seventh steps; and an eighth step of translating the stage a distance corresponding to a width of one block along the Y-axis direction after the seventh step, wherein the second to seventh steps are repeated after the eighth step.

* * * * *